(12) United States Patent
Yeh

(10) Patent No.: US 6,491,359 B1
(45) Date of Patent: Dec. 10, 2002

(54) PORTABLE COMPUTER HAVING IDENTIFICATION MARKS

(75) Inventor: Shih-Ping Yeh, Taipei (TW)

(73) Assignee: AsusTek Computer Inc., Taipei (TW)

( * ) Notice: Subject to any disclaimer, the term of this patent is extended or adjusted under 35 U.S.C. 154(b) by 0 days.

(21) Appl. No.: 09/638,917

(22) Filed: Aug. 16, 2000

(30) Foreign Application Priority Data

May 11, 2000 (TW) ........................................ 89207942 U

(51) Int. Cl.[7] .............................................. A47B 81/00
(52) U.S. Cl. ................................. 312/234; 312/223.2
(58) Field of Search ........................... 312/223.2, 234, 312/257.1, 234.1, 234.2; 40/299.07; 71/631

(56) References Cited

U.S. PATENT DOCUMENTS

| | | | | |
|---|---|---|---|---|
| 702,904 A | * | 6/1902 | Abraham | 312/234 X |
| 1,720,061 A | * | 7/1929 | Schmitt | 312/234 X |
| 1,974,234 A | * | 9/1934 | Byrnes et al. | 312/234 X |
| 3,238,629 A | * | 3/1966 | Hurwitz | 40/229.01 X |
| 3,319,780 A | * | 5/1967 | Russell | 312/234.1 X |
| 3,478,457 A | * | 11/1969 | Watkins | 312/234 X |
| 3,879,095 A | * | 4/1975 | Seamans et al. | 312/234 X |
| 5,309,741 A | * | 5/1994 | Nava | 40/229.01 X |
| 5,363,578 A | * | 11/1994 | Chesley et al. | 312/234 X |
| 6,147,862 A | * | 11/2000 | Ho | 312/223.2 X |
| 6,246,580 B1 | * | 6/2001 | Weng | 312/223.2 X |

FOREIGN PATENT DOCUMENTS

| | | | | |
|---|---|---|---|---|
| EP | 403670 | * | 12/1990 | 312/234 |
| JP | 04005789 | * | 1/1992 | 312/234 |

* cited by examiner

Primary Examiner—Jose V. Chen
Assistant Examiner—Hanh V. Tran
(74) Attorney, Agent, or Firm—Rabin & Berdo, P.C.

(57) ABSTRACT

A portable computer having identification marks. The identification marks are beside screw holes in which screws are to-be-screwed. The identification marks show the appearance of the screw, the cross-section patterns or the 3-dimentional patterns of the screws.

16 Claims, 1 Drawing Sheet

PORTABLE COMPUTER HAVING IDENTIFICATION MARKS

BACKGROUND OF THE INVENTION

This application incorporates by reference Taiwanese application Serial No. 89207942, Filed May 11, 2000.

1. Field of the Invention

The invention relates in general to a portable computer having identification marks beside the screw holes, and more particularly to a portable computer having identification marks beside screw holes in which screws are to-be-screwed.

2. Description of the Related Art

As semiconductor technologies advance by leaps and bounds, electronic components are indispensable to modern equipments. Furthermore, miniaturization has been the goal of electronic equipment producers resulting in mini-television, mini-camera and so on. Among these electronic products, computers, especially portable computers, have become crucial tools in just about every field nowadays due to its portability, simplicity, and size.

The housing and the interior devices of the portable computer are usually screwed by screws with different sizes. Screws match only the corresponding screw holes. The using of a great variety of screws causes the procedure of either assembling or disassembling more minute and complicated.

SUMMARY OF THE INVENTION

It is therefore an object of the invention to provide a portable computer having identification marks beside screw holes in which screws are to-be-screwed so that the efficiency of assembling and disassembling is highly increased.

It is another object of the invention to provide a portable computer having identification marks, including a number of first screw holes, a number of second screw holes, a number of screws, which correspond to the first screw holes respectively and a number of identification marks beside the first screw holes. Therefore, each of the screws can be screwed into each of the corresponding first screw holes correctly.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
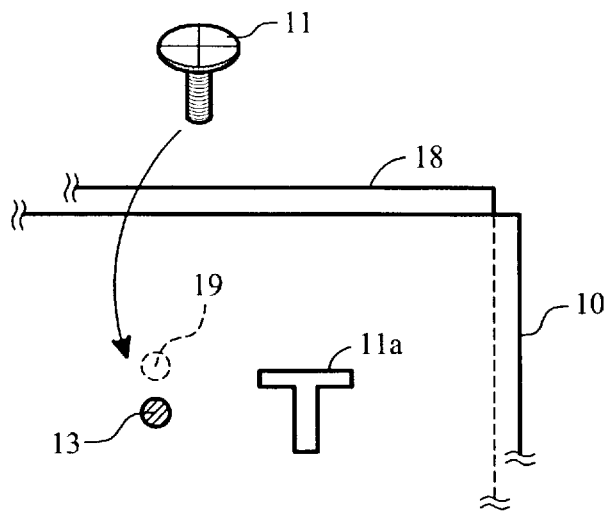
FIGS. 1A to 1C show the structures of screws and the corresponding screw holes according to a preferred embodiment of the invention.
Figure 1B:
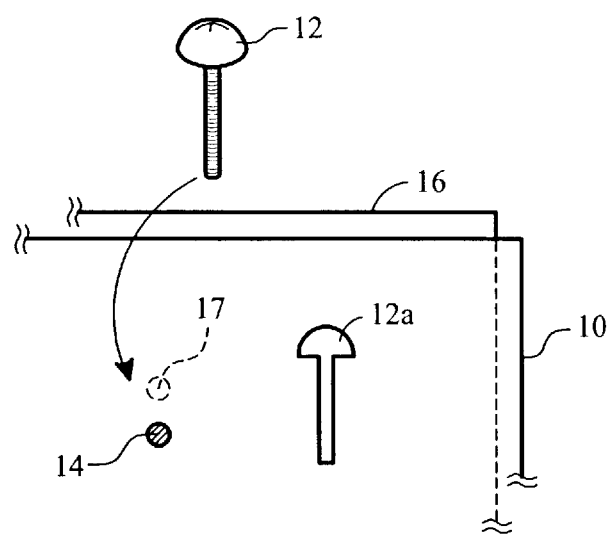
Figure 1C:
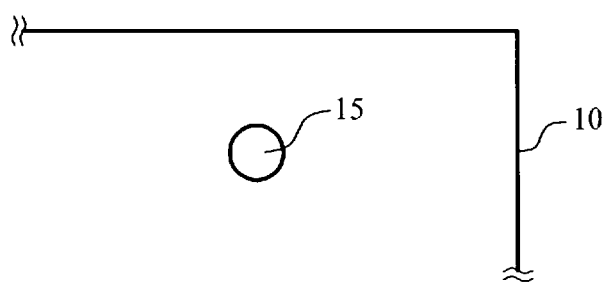

Illustrative diagrams showing the structures of screws and the corresponding screw holes according to a preferred embodiment of the invention are as in FIG. 1A, FIG. 1B and FIG. 1C. Screw 11 and screw 12 are representative screws to be screwed in the portable computer members 10,16 and 18. The first screw holes 13,19 and the first screw holes 14,17 are corresponding holes of the screw 11 and the screw 12. As shown in FIG. 1A and FIG. 1B, the screw 11 and the screw 12 have different sizes, width, length and shapes and therefore the appearances of the corresponding screw hole 13 and screw hole 14 are various.

According to a preferred embodiment of the invention, identification marks are labeled beside the first screw holes 13, 14. The identification marks 11a, 12a can be any pattern or number only if they can function as identification marks. For example, the identification marks 11a, 12a can be cross-sectional patterns or 3-dimentional patterns showing the appearance of the corresponding screws or representative numbers. Consequently, the assembling and disassembling of the portable computer 10 become more easily.

Furthermore, as shown in FIG. 1C, a portable computer 10 may contain the second screw hole 15, which needs not to be screwed with screws. According to a preferred embodiment of the invention, beside the second screw hole 15, no identification mark is needed.

Consequently, the assembling procedure is greatly simplified by using the identification marks of the preferred embodiment of the invention. People who assembles the computer can turn the right screws into the corresponding screw holes simply by checking the identification marks beside the screw holes. If no identification mark is found, no screw has to be screwed in.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A portable computer having identification marks to provide assembly means, said assembly means comprising:
    a plurality of screw holes;
    a plurality of screws, which correspond to the screw holes respectively; and
    a plurality of marks near the screw holes for identifying each of the screws according to characteristics thereof so that said each of the screws can be screwed into each of the corresponding screw holes, thereby facilitating the assembly of said portable computer.

2. The portable computer of claim 1, wherein the identification marks show appearances of the screws.

3. The portable computer of claim 1, wherein the identification marks are cross-sectional patterns showing appearances of the screws.

4. The portable computer of claim 1, wherein the identification marks are representative numbers.

5. A portable computer having identification marks to provide assembly means, said assembly means comprising:
    a plurality of first screw holes;
    a plurality of second screw holes;
    a plurality of screws, which correspond to the first screw holes respectively; and
    a plurality of marks near the first screw holes for identifying each of the screws according to characteristics thereof so that said each of the screws can be screwed into each of the corresponding first screw holes thereby facilitating the assembly of portable computer.

6. The portable computer of claim 5, wherein the identification marks show appearances of the screws.

7. The portable computer of claim 5, wherein the identification marks are cross-sectional patterns showing appearances of the screws.

8. The portable computer of claim 5, wherein the identification marks are representative numbers.

9. A portable computer having identification marks to provide assembly means, said assembly means comprising:
- a plurality of computer members, a plurality of screw holes, of differing shapes, formed in the computer members;
- a plurality of screws, which correspond to the screw holes respectively, and which are screwed into the holes so as to connect the computer members together; and
- a plurality of marks near the screw holes for identifying each of the screws according to characteristics thereof, so that the correspondence between the screws and the holes are identifiable prior to screwing the screws into the holes to connect the computer members together, thereby facilitating the assembly of said portable computer.

10. The portable computer of claim 9, wherein the identification marks show appearances of the screws.

11. The portable computer of claim 9, wherein the identification marks are representative numbers.

12. The portable computer of claim 9, wherein the identification marks are cross-sectional patterns showing appearances of the screws.

13. A portable computer having identification marks to provide assembly means, said assembly means comprising:
- a plurality of computer members having therein first screw holes and second screw holes differing from the first screw holes;
- a plurality of screws, screwing the computer members together through the first screw holes;
- a plurality of marks near the first screw holes for identifying each of the screws corresponding thereto according to characteristics thereof, so that the correspondence between the first screw holes and the screws can be observed prior to screwing the screws into the holes to connect the computer members together, thereby facilitating the assembly of said portable computer.

14. The portable computer of claim 13, wherein the identification marks show appearances of the screws.

15. The portable computer of claim 13, wherein the identification marks are representative numbers.

16. The portable computer of claim 13, wherein the identification marks are cross-sectional patterns showing appearances of the screws.

* * * * *